United States Patent [19]

Okitaka et al.

[11] Patent Number: 4,806,802

[45] Date of Patent: Feb. 21, 1989

[54] CMOS CIRCUIT HAVING SHOOT THROUGH CURRENT CONTROL

[75] Inventors: Takenori Okitaka; Yukio Miyazaki, both of Hyogo, Japan

[73] Assignee: Mitsubishi Denki Kabushiki Kaisha, Tokyo, Japan

[21] Appl. No.: 91,132

[22] Filed: Aug. 31, 1987

[30] Foreign Application Priority Data

Aug. 29, 1986 [JP] Japan ................................. 61-204262
Oct. 1, 1986 [JP] Japan ................................. 61-235047

[51] Int. Cl.$^4$ .................... H03K 17/16; H03K 17/26; H03K 17/687; H03K 19/003
[52] U.S. Cl. .................................. 307/542; 307/443; 307/568; 307/558; 307/585; 307/451
[58] Field of Search ............... 307/475, 450, 451, 443, 307/585, 576, 579, 270, 568, 558, 255, 288, 290, 279, 542; 365/104, 156, 181, 190

[56] References Cited

U.S. PATENT DOCUMENTS

| | | | |
|---|---|---|---|
| 4,295,062 | 10/1981 | Mihalich et al. | 307/279 |
| 4,438,352 | 3/1984 | Mardkha | 307/451 X |
| 4,507,649 | 3/1985 | Dingwall et al. | 307/585 X |
| 4,563,594 | 1/1986 | Koyama | 307/451 X |
| 4,649,295 | 3/1987 | McLaughlin et al. | 307/451 X |
| 4,654,548 | 3/1987 | Tanizawa et al. | 307/451 X |

OTHER PUBLICATIONS

Dingwall, "Improved COS/MOS Inverter Circuit for Reducing Burnout and Latchout", RCA Technical Notes, Tn 1230, pp. 1-4, Jul. 25, 1979.

Primary Examiner—Stanley D. Miller
Assistant Examiner—David R. Bertelson
Attorney, Agent, or Firm—Sughrue, Mion, Zinn, Macpeak & Seas

[57] ABSTRACT

A complemenary MOS integrated circuit comprising an output circuit and a pre-output circuit, which is capable of reducing a penetration current which occurs upon switching of transistors in the output circuit, to thereby suppress an occurrence of spike noises in an output signal. The pre-output circuit comprises MOS transistors constituting an analog switch, "on-resistances" of which are utilized as a resistor, and MOS transistor gates. A series circuit of the analog switch and the gates are coupled in series with a power source.

4 Claims, 6 Drawing Sheets

| V_IN  R | 0 | $V_1$ | $V_2$ | $V_3$ | Vcc |
|---|---|---|---|---|---|
| R107 | 1 | 10 | 50 | 100 | ∞ |
| R108 | ∞ | 100 | 50 | 10 | 1 |
| $V_{GP}$ $V_{GN}$ | Vcc | $\frac{10}{11}$ Vcc | $\frac{5}{10}$ Vcc | $\frac{1}{11}$ Vcc | GND |

| $V_{IN}$ R,$V_G$ | 0 | $V_1$ | $V_2$ | $V_3$ | Vcc |
|---|---|---|---|---|---|
| R1 | 1 | 2 | 6 | 60 | ∞ |
| R2 | ∞ | 60 | 6 | 2 | 1 |
| R3 | 1 | 1 | 1 | 1 | 1 |
| $V_{GP}$ | Vcc | $\frac{61}{63}$ Vcc | $\frac{7}{13}$ Vcc | $\frac{3}{63}$ Vcc | 0 |
| $V_{GN}$ | Vcc | $\frac{60}{63}$ Vcc | $\frac{6}{13}$ Vcc | $\frac{2}{63}$ Vcc | 0 |

| $V_{IN}$ \ R | 0 | $V_1$ | $V_2$ | $V_3$ | $V_{CC}$ |
|---|---|---|---|---|---|
| R107 | 1 | 10 | 60 | 100 | ∞ |
| R109 | 100 | 190 | 280 | 190 | 100 |
| R108 | ∞ | 100 | 60 | 10 | 1 |
| $V_{GP}$ | $V_{CC}$ | $\frac{29}{30} V_{CC}$ | $\frac{34}{40} V_{CC}$ | $\frac{20}{30} V_{CC}$ | GND |
| $V_{GN}$ | $V_{CC}$ | $\frac{10}{30} V_{CC}$ | $\frac{6}{40} V_{CC}$ | $\frac{1}{30} V_{CC}$ | GND |

| V_IN<br>R.V_G | 0 | $V_1$ | $V_2$ | $V_3$ | Vcc |
|---|---|---|---|---|---|
| R1 | 1 | 2 | 6 | 60 | ∞ |
| R2 | ∞ | 60 | 6 | 2 | 1 |
| R3 | 1 | 1 | 1 | 1 | 1 |
| R4 | 5 | 10 | 15 | 10 | 5 |
| $V_{GP}$ | Vcc | $\frac{71}{73}$ Vcc | $\frac{22}{28}$ Vcc | $\frac{13}{73}$ Vcc | 0 |
| $V_{GN}$ | Vcc | $\frac{60}{73}$ Vcc | $\frac{6}{28}$ Vcc | $\frac{2}{73}$ Vcc | 0 |

CMOS CIRCUIT HAVING SHOOT THROUGH CURRENT CONTROL

BACKGROUND OF THE INVENTION (1) Field of the Invention

This invention relates to complementary MOS integrated circuits (hereinafter referred to as "CMOS circuits", when applicable), and more particularly to a CMOS circuit in which the generation of noises can be suppressed even when the drive capacity of an output circuit is increased, for instance, for high speed operation.

(2) Description of the Prior Art

Figure 1:
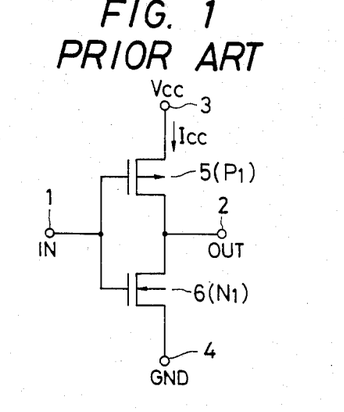
FIG. 1 is a circuit diagram showing the simplest arrangement of a conventional CMOS circuit.

FIG. 1 shows a conventional CMOS output circuit. In FIG. 1, reference numeral 1 designates an input terminal; 2, an output terminal; 3, a power source terminal to which a voltage Vcc is applied as a power source; 4, a ground (GND) terminal; 5, a P-channel MOS transistor; and 6, an N-channel MOS transistor.

In FIG. 1, when an input voltage applied to the input terminal 1 is at the ground (GND) potential, the P-channel MOS transistor 5 is turned on, while the N-channel MOS transistor 6 is turned off, so that the output terminal 2 is held at the potential Vcc. When, in contrast, the input voltage is at Vcc, the P-channel MOS transistor 5 is turned off, while the N-channel MOS transistor 6 is turned on, so that the output terminal 2 is held at the ground (GND) potential. When the voltage is between the GND and Vcc, the potential of the output terminal 2 is determined according to the so-called "on-resistance ratio" of the MOS transistors 5 and 6.

Figure 2:
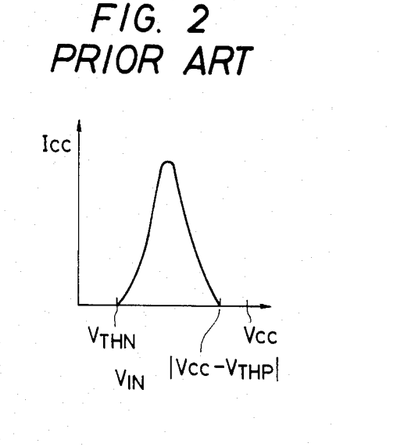
FIG. 2 is a graphical representation showing a penetration current in the circuit of FIG. 1.

FIG. 2 is a graphical representation indicating a penetration current (Icc) with the input voltage in FIG. 1. In FIG. 2, reference character $V_{THN}$ designates the threshold voltage of the N-channel MOS transistor and $V_{THP}$, the threshold voltage of the P-channel MOS transistor. As is apparent from FIG. 2, in general, the P-channel MOS transistor 5 and the N-channel MOS transistor 6 are so selected that the penetration current ($I_{cc}$) reaches the peak value when the input potential is about ½ Vcc.

Figure 3:
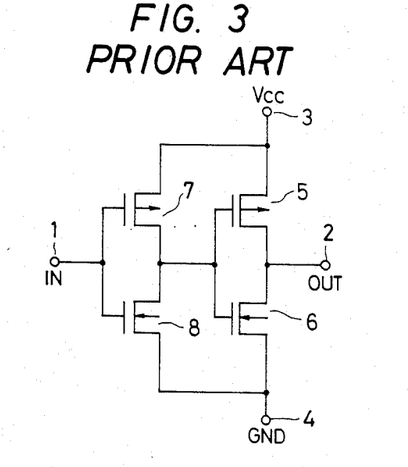
FIG. 3 is a circuit diagram showing the CMOS circuit with a conventional pre-output circuit.

FIG. 3 is a circuit diagram showing a drive circuit for driving the CMOS output circuit of FIG. 1 (hereinafter referred to as "pre-output circuit", when applicable). The pre-output circuit is made up of a P-channel MOS transistor 7 and an N-channel MOS transistor 8, to drive the CMOS output circuit of FIG. 1.

Figure 6:
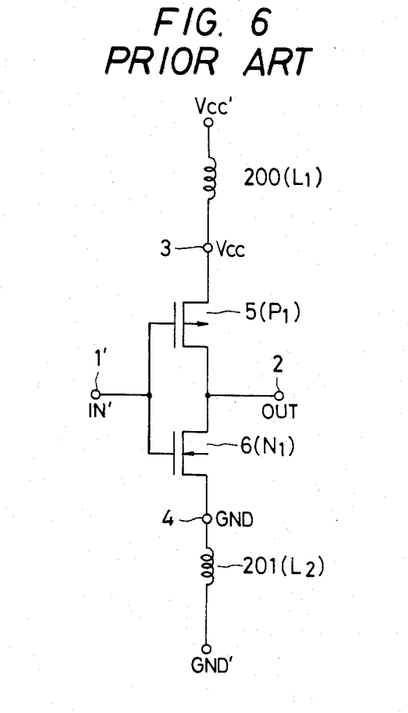
FIG. 6 is a circuit diagram showing an equivalent circuit of the CMOS circuit formed on a printed circuit board.

FIG. 6 shows the CMOS output circuit installed on a printed circuit board. As shown in FIG. 6, inductance components 200 and 201 formed by the frame and conductors of the integrated circuit and the wiring of a printed circuit board are connected between the power source terminal 3 and an external power source Vcc' and between the ground (GND) terminal 4 and the ground terminal GND' of the external power source, respectively.

Figure 8:
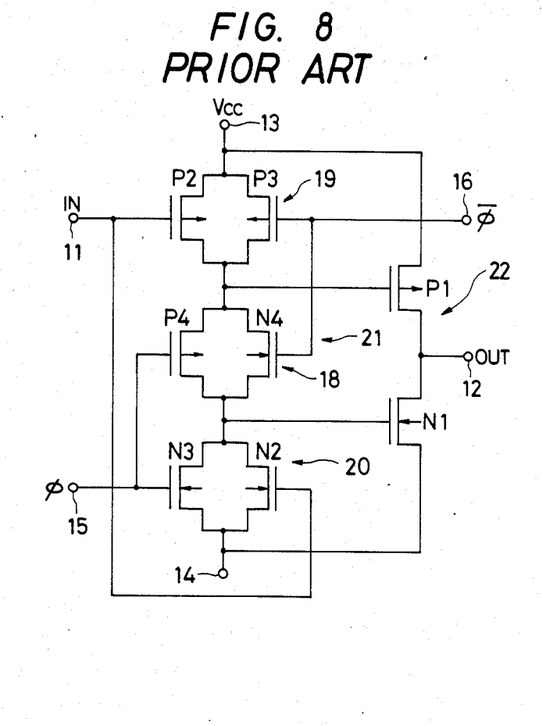
FIG. 8 is a circuit diagram showing a conventional three-state complementary MOS integrated circuit.

Next, a conventional three-state complementary MOS integrated circuit is as shown in FIG. 8.

In FIG. 8, reference numeral 11 designates an input terminal; 12, an output terminal; 13, a power source terminal (a first power source) to which a voltage Vcc is supplied; 14, a ground terminal (a second power source); 15, a control input terminal to which a first control signal $\phi$ is applied; 16, a control input terminal to which a second control signal $\bar{\phi}$ is supplied; P1, P2, P3 and P4, p-channel MOS transistors; 18, a first analog switch consisting of the transistors N4 and P4; 19, a first parallel transistor circuit consisting of the transistors P2 and P3; 20, a second parallel transistor circuit consisting of the transistors N2 and N3; 21, a pre-output circuit consisting of the first analog switch 18 and the first and second parallel transistor circuits 19 and 20; and 22, an output circuit including the transistors P1 and N1.

The conventional three-state complementary MOS integrated circuit thus organized operates as follows.

When the control input terminal 15 is held at a low level (hereinafter referred to merely as "L", when applicable) and the control input terminal 16 is held at a high level (hereinafter referred to merely as "H", when applicable), the transistors P3 and N3 are rendered non-conductive (off) whereas the transistors P4 and N4 are rendered conductive (on). Therefore, if the input terminal 11 is at "L", then an "L" signal is provided at the output terminal 12; and if the input terminal 11 is at "H", then an "H" signal is provided at the output terminal 12. On the other hand, when the control input terminal 15 is held at "H" and the control input terminal 16 is at "L", the transistors P3 and N3 are rendered conductive (on). Therefore, irrespective of the level at the input terminal 11, the transistors P1 and N1 are turned off, and the output terminal 12 is held high in impedance.

The output circuit which is obtained by rendering the transistors P4 and N4 of FIG. 8 conductive (on) and disregarding the "on-resistances" of these transistors P4 and N4, is equivalent to that of an ordinary complementary MOS circuit as shown in FIG. 1.

Figure 7:
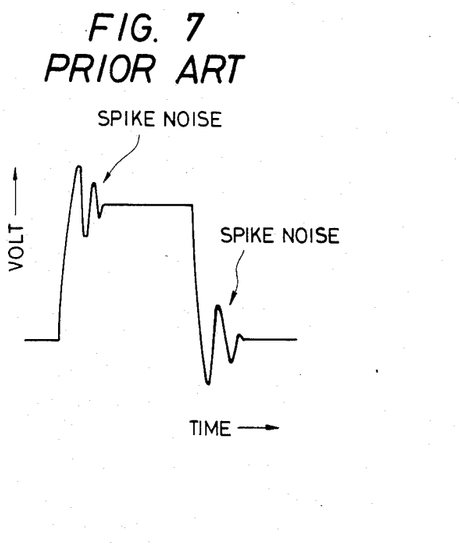
FIG. 7 is a diagram showing spike noises occurring when the output level of the CMOS circuit is switched.

In order to meet the recent requirement of high speed operation, the current capacity (or drive capacity) of the MOS transistors forming the output circuit has been set to a large value, for instance 200 to 300 mA with Vcc= 5V. Accordingly, the above-described penetration current is also increased, and a spike voltage e= −(di/dt)) induced by the inductance components 200($L_1$) and 201($L_2$) in FIG. 6 is increased, thus resulting in an erroneous operation. FIG. 7 shows one example of a waveform at the output terminal 2, which includes a spike noise. In FIG. 7, the horizontal axis represents time whereas the vertical axis represents voltage. As is apparent from FIG. 7, when the output signal changes from "L" to "H" or vice versa, a large spike noise is generated, thus causing an erroneous operation of a circuit which is driven by the output of the output circuit.

SUMMARY OF THE INVENTION

Accordingly, an object of this invention is to eliminate the above-described difficulties and drawbacks accompanying a conventional CMOS integrated circuit. More specifically, an object of the invention is to provide a complementary MOS integrated circuit in which, even when MOS transistors which are high in drive capacity are employed for forming an output circuit, the increase in the penetration current is suppressed, a spike noise occurring at the time of switching the transistors is decreased, and the increase of the power consumption attributing to the increase of the penetration current is also prevented.

The above and other objects of the present invention is met by the provision of a complementary MOS integrated circuit comprising an output circuit and a pre-output circuit, in which MOS transistors constituting an analog switch, "on-resistances" of which are utilized as a resistor, are coupled between MOS transistor gates in the pre-output circuit.

A three-state complementary MOS integrated circuit according to the invention comprises an output circuit and a pre-output circuit including MOS transistor gates and a series circuit of a first analog switch serving as a resistor means and a second analog switch for providing three-state, the series circuit being coupled between the MOS transistor gates.

BRIEF DESCRIPTION OF THE DRAWINGS

In the accompanying drawings

DESCRIPTION OF THE PREFERRED EMBODIMENTS

Figure 11:
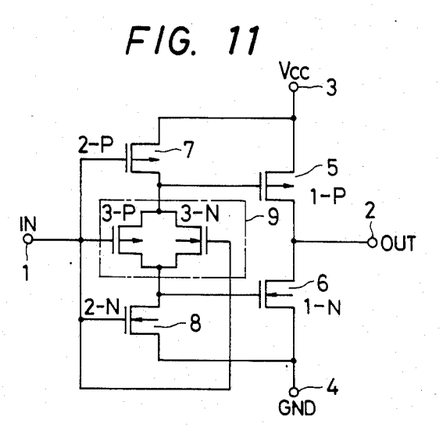
FIG. 11 is a circuit diagram showing a complementary MOS integrated circuit which is one embodiment of this invention.

FIG. 11 is a circuit diagram showing one example of a complementary MOS integrated circuit according to this invention, which comprises an output circuit and a pre-output circuit. The CMOS circuit of the invention can be obtained by modifying the conventional circuit of FIG. 3 as follows: An analog switch 9 comprising a parallel circuit of a P-channel MOS transistor and an N-channel transistor is connected between the drain of the P-channel MOS transistor 7 and the drain of the N-channel MOS transistor 8 in FIG. 3.

The effects of the invention will be described through comparison between the conventional CMOS circuit of FIG. 3 and the CMOS circuit of FIG. 11.

First, in the conventional CMOS circuit of FIG. 3, the penetration current will be described.

Figure 4:
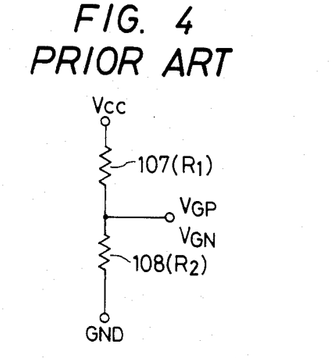
FIG. 4 is a circuit diagram showing an equivalent circuit of the pre-output circuit of FIG. 3.
Figure 5:
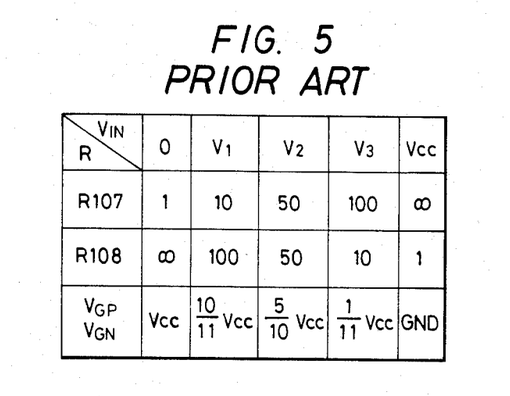
FIG. 5 is a table for calculation of a penetration current in the circuit of FIG. 3.

FIG. 4 shows an equivalent circuit of the pre-output circuit in FIG. 3. A resistor 107 represents the so-called "on-resistances of the MOS transistor 7 and a resistor 108 represents the "on-resistance" of the MOS transistor 8. FIG. 5 is a table indicating input voltages ($V_{IN}$) ranged from 0 to Vcc with the "on-resistances" of the MOS transistors which are standardized for simplification in description. For instance, the resistance of the resistor 107($R_1$) is 1 when $V_{IN}$ is 0(V), 10 when $V_{IN}$ is $V_1$(V), and so forth. In FIG. 3, the gate voltages of the MOS transistors 5 and 6 in the output circuit are equal as designated by reference characters $V_{GP}$ and $V_{GN}$ in the table. In the case of the table of FIG. 5, the penetration current reaches its peak value when the input voltage is $V_2$. In this case, the gate voltage of the MOS transistors in the output circuit is:

$$50/100 \cdot Vcc = \tfrac{1}{2} \cdot Vcc$$

In this case, the penetration current ($I_{cc}$) flowing in the output circuit is:

$$I_{cc} = K(Vcc/2 - V_{TH})^2 \qquad (1)$$

where K is the conductance coefficient, and $V_{TH}$ is the threshold voltage of the MOS transistors (the P-channel and N-channel MOS transistors 5 and 6 having the same conductance coefficient and the same threshold voltage).

Assuming that Vcc=5V and $V_{TH}$=0.7V, then $I_{cc}$ is as follows:

$$I_{CC} = K\{(5/2) - 0.7\}^2 = 3.24K \qquad (2)$$

Now, in the CMOS circuit of FIG. 11, the penetration current will be described.

Figure 12:
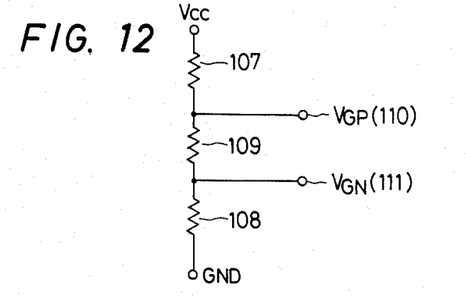
FIG. 12 is a circuit diagram showing an equivalent circuit of a pre-output circuit in FIG. 11.

FIG. 12, corresponding to FIG. 4, shows an equivalent circuit of the pre-output circuit in the CMOS circuit of FIG. 11. In the circuit of FIG. 12, a resistor 109 is connected between the resistors 107 and 108, and therefore the gate voltage of the P-channel MOS transistor 5 is different from that of the N-channel transistor 6 in the output circuit. In FIG. 12, the resistor 109 represents the "on resistance" of the analog switch 9 in FIG. 11.

Further in FIG. 12, reference character $V_{GP}$(110) represents the voltage applied to the gate Of the P-channel MOS transistor 5, and $V_{GN}$(111) represents the voltage applied to the gate of the N-channel MOS transistor 6.

As shown in FIG. 11, the gates of the P-channel MOS transistor and the N-channel transistor in the analog switch 9 are connected to the input terminal 1. Therefore, the resistance of the resistor 109 varies depending on the input. In general, when the input voltage is Vcc/2, both of the gate voltages of the P-channel MOS transistor and the N-channel MOS transistor in the analog switch 9 are decreased, and the resistance of the analog switch is thus made maximum as shown in FIG.

Figure 13:
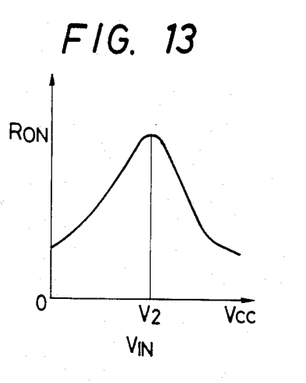
FIG. 13 is a graphical representation indicating input voltages and "on-resistances" of an analog switch in the pre-output circuit in FIG. 11.

13. The "on-resistance" is the reciprocal of the transistor capacity:

$$1/K(V_G - T_{TH})^2$$

where similarly as in equation (1), K is the conductance coefficient, $V_G$ is the gate voltage of the MOS transistors, and $V_{TH}$ is the threshold voltage of the MOS transistors (the P-channel MOS transistor and the N-channel MOS transistor of the analog switch 9 having the same conductance coefficient K and the same threshold voltage $V_{TH}$).

For instance, when Vcc=5 and $V_{TH}$=0.7 V, the ratio of the "on-resistance" with $V_{IN}$=OV to the "on-resistance" with $V_{IN}$=Vcc/2 is as follows:
When $V_{IN}$=OV, the "On-resistance" is :

$$R \propto \frac{1}{K(5 - 0 - 0.7)^2 + (1/\infty)} \approx \frac{1}{4.3^2 K}$$

When $V_{IN}$=Vcc/2, the "on resistance: is:

$$R \propto \frac{1}{K\left(5 - \frac{2}{5} - 0.7\right)^2 + K\left(\frac{5}{2} - 0.7\right)^2} = \frac{1}{2 \times 1.8^2 K}$$

"on-resistance ($V_{IN}$=OV)": "On-resistance ($V_{IN}$=Vcc/2)

$$= \frac{1}{4.3^2 K} : \frac{1}{2 \times 1.8^2 K} \approx 1:2.8$$

Figure 14:
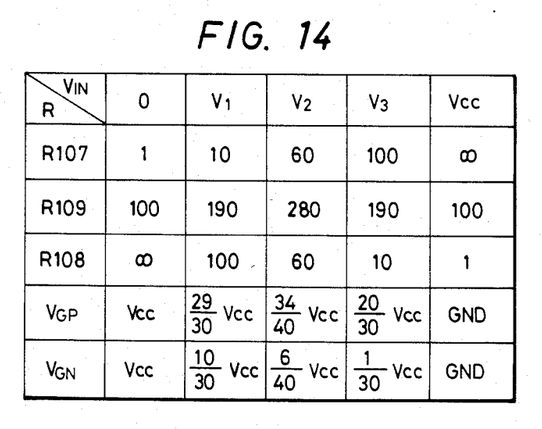
FIG. 14 is a table for calculation of a penetration current in FIG. 11.

FIG. 14, corresponding to FIG. 5, shows a table indicating the resistances of the MOS transistors and the resistor 109 connected therebetween, which are standardized for simplification of description.

As is apparent from FIG. 14, when the penetration current reaches its peak value, the gate-source voltage of the N-channel MOS transistor 6 is 6/40 Vcc, and the gate-source voltage of the P-channel MOS transistor 5 is (Vcc−34 Vcc/40 =6/40·Vcc. Similarly as in the case of FIG. 5, the current Icc flowing in the output circuit is:

$$I_{cc} = K\{(6 \times vcc)/40 - V_{TH}\}^2 \tag{3}$$

Similarly, when Vcc=5V and $V_{TH}$=0.7 V for instance, $$I_{cc} = K\{(6 \times 5)/40 - 0.7\}^2 = 0.0025K \tag{4}$$

That is, the penetration current $I_{cc}$ is reduced to less than 1/1000 of that in the conventional circuit (See equation (2). Furthermore, as is apparent from a comparison of FIGS. 3 and 11, the P-channel MOS transistor 5 and the N-channel MOS transistor 6 provide completely the same current capacity (or drive capacity), and its goes without saying that the CMOS circuit operates at a sufficiently high speed even for a capacitive load. In FIG. 12, the voltages $V_{GP}$(100) and $V_{GN}$(111) are determined according to the resistance ratio. In FIG. 11, all the resistances are provided by the MOS transistors. These MOS transistors are fluctuated in dimension in the same manner (for instance, the gate length L being increased or decreased); however, the fluctuation can be substantially disregarded because the voltages are determined according to the resistance ratio. Thus, the CMOS circuit of the invention is substantially free from the dimensional fluctuation of the MOS transistors.

Figure 15:
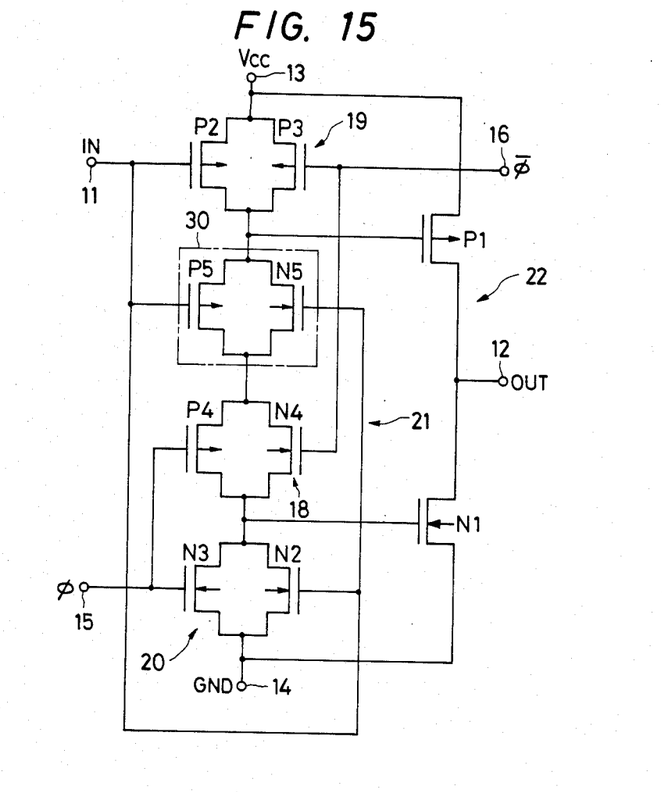
FIG. 15 is a circuit diagram showing one example of a three-state complementary MOS integrated circuit according to this invention.

FIG. 15 shows an example of a three-state complementary MOS integrated circuit according to the present invention in which circuit components that are the same as those in FIG. 8 bear the same or corresponding reference numerals or characters. In FIG. 15, reference numeral 30 denotes a second analog switch including a P-channel MOS transistor P5 and an N-channel MOS transistor N5. The second analog switch 30 is connected between the first parallel transistor circuit 19 and the first analog switch 18 in the pre-output circuit 21.

Figure 16:
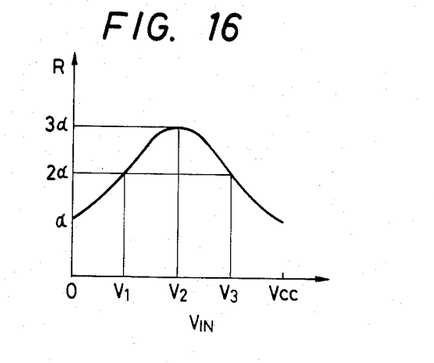
FIG. 16 is a graphical representation indicating the standardized "on-resistance" of an analog switch 30 which is used as resistance with the potential of an input terminal 1.

FIG. 16 is a graphical representation indicating the standardized "on-resistance" of the second analog switch 30 with the potential at the input terminal 11.

The three-state complementary MOS integrated circuit thus organized operates as follows:

Similarly as in the case of the conventional three-state complementary MOS integrated circuit of FIG. 8, when the control input terminal 15 is at "L" and the other control input terminal 16 is at "H", the transistors P3 and N3 are rendered non-conductive (off) whereas the transistors P4 and N4 are rendered conductive (on). Therefore, if the input terminal 11 is at "L", the transistors P2, P5 and Nl are rendered conductive (on) and the transistor PI is rendered non-conductive (off). As a result, an "L" signal is provided at the output terminal 12. When, on the other hand, the control input terminal 15 is at "H" and the control input terminal 16 is at "L", the transistors P3 and N3 are rendered conductive (on) whereas the transistors P4 and N4 are rendered non-conductive (off). Therefore, irrespective of the potential at the input terminal 11, the transistors Pl and N1 are rendered non-conductive (off). and the output terminal 12 is held high in impedance.

The effects of the embodiment will be described by comparing the embodiment of the invention (FIG. 15) and the conventional circuit (FIG. 8) with each other.

Figure 9:
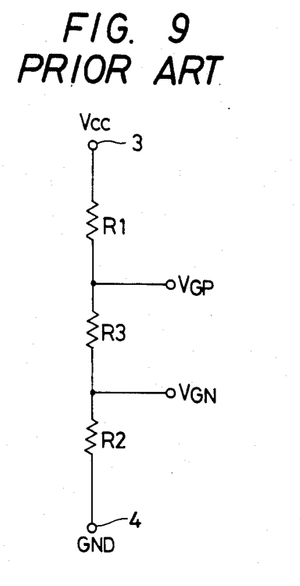
FIG. 9 is an equivalent circuit of the pre-output circuit in FIG. 8.

First, in the conventional circuit of FIG. 8, the penetration current of the output circuit will be investigated. FIG. 9 is a diagram showing an equivalent circuit of the pre-output circuit in FIG. 8. When the control input terminals 15 and 16 are at "L" and "H", respectively, the transistors P3 and N3 are rendered non-conductive conductive (off), and therefore the transistors P3 and N3 are not included in the equivalent circuit. In FIG. 9, reference characters R1, R2 and R3 designate the "on-resistances" of the transistor P2, the transistor N2, and the analog switch 18 consisting of the transistors N4 and P4,respectively; and $V_{GP}$ and $V_{GN}$, the gate voltages of the transistors Pl and Nl, respectively.

Figure 10:
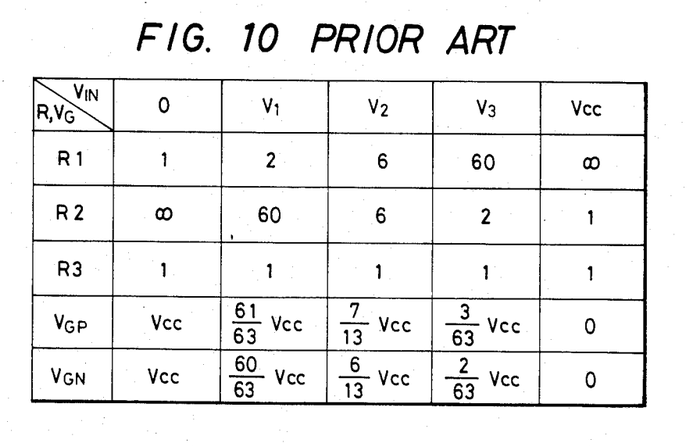
FIG. 10 is a table indicating the standardized "on-resistances" of R1 through R3 and the Variations of $V_{GP}$ and $V_{GN}$ which are provided when the potential of an input terminal 1 changes from 0V to Vcc in FIG. 8.

FIG. 10 indicates the standardized "on-resistances" of R1, R2 and R3 and the variation of $V_{GP}$ and $V_{GN}$ provided when the potential $V_{IN}$ of the input terminal 11 changes from OV to $V_{CC}$.

In FIG. 10, the peak of the penetration current appears when the input voltage is V2. The penetration current at that moment can be represented by the following equation:

$$I_{cc} = K(V_{cc} - V_{GP} - V_{TH}) \tag{5}$$

or $$I_{cc} = K(V_{GN} - V_{TH})^2 \tag{6}$$

That is, the smaller of the values Icc is the penetration current.

If Vcc=5 V and $V_{TH}=0.7$ V, then $$Icc = K\left(5 \times \frac{6}{13} - 0.7\right)^2 = 2.58K$$

In the above equations, K is conductance coefficient, and $V_{TH}$ is the threshould voltage of a MOS transistor. And the transistors P2, P4 N2 and N4 are equal to each other in the conductance coefficient and the threshould voltage.

Figure 17:
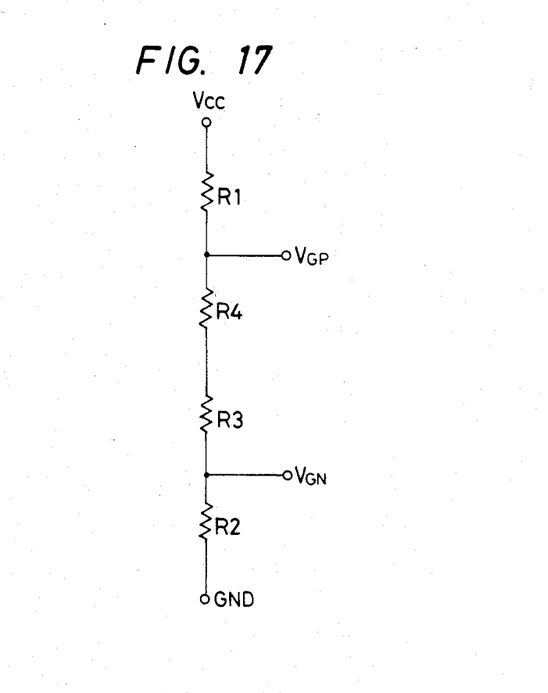
FIG. 17 is an equivalent circuit of a pre-output circuit in FIG. 15.

Now, similarly, in the circuit of the invention of FIG. 15, the penetration current will be investigated. FIG. 17 is an equivalent circuit of the pre-output circuit in FIG. 15 in the case where the control input terminals 15 and 16 are at "L" and "H", respectively. In this case, the transistors P3 and N3 are non-conductive (off), and therefore these transistors P3 and N3 are not included in the equivalent circuit. In FIG. 17, reference characters R1, R2, R3 and R4 designate the "on-resistances" of the transistor P2, N2, the analog switch 18 consisting of the transistors P4 and N4, and the analog switch 30 consisting of the transistors P5 and N5, respectively, and reference characters $V_{GP}$ and $V_{GN}$ designate the gate voltages of the transistors P1 and N1, respectively.

Figure 18:
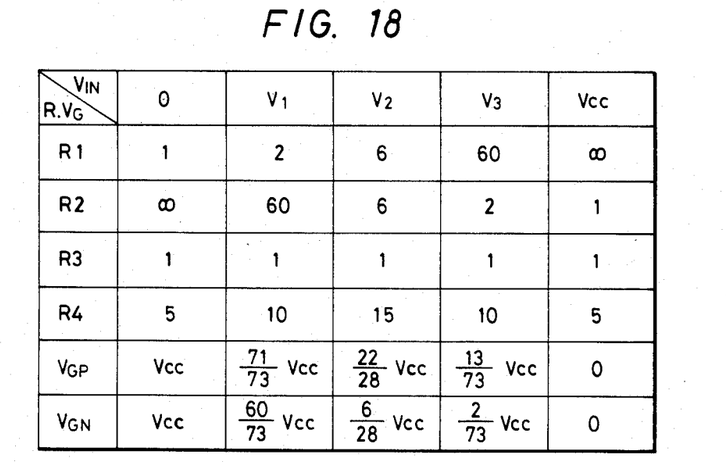
FIG. 18 is a table indicating the standardized "on-resistances" of R1 through R4 and the Variations Of $V_{GP}$ and $V_{GN}$ which are provided when the potential of the input terminal 1 changes from 0V to Vcc in FIG. 15.

FIG. 18 indicates the standardized "on-resistances" of R1 through R4, and the variations of $V_{GP}$ and $V_{GN}$ when the potential of the input terminal 11 changes from 0V to Vcc.

In the circuit of FIG. 15, the gate of the analog switch 30 is connected to the input terminal 12, and as shown in FIG. 16, when the potential of the input terminal 12 is V2, the "on-resistance" of the analog switch 30 becomes maximum because the gate voltages of the transistors P5 and N5 decrease. The "on-resistance" of a MOS transistor is determined by the reciprocal of equation (5) or (6). The "on-resistance" of the analog switch 30 is the parallel resistance of the transistors P5 and N5. The ratio of the "on-resistance" of the analog switch 30 provided when the potential of the input terminal 11 is 0V to that of the analog switch provided when the potential of the input terminal is Vcc/2 is as follows:

resistance element. However, these MOS transistors are equal in threshold voltage to one another.

As is apparent from the above description, the penetration current of the output circuit in the integrated circuit of the invention (FIG. 15) can be reduced to about one-twentieth of that of the output circuit in the conventional circuit (FIG. 8).

The output circuits of FIGS. 8 and 15 are completely equal to each other in current capacity (or drive capacity). Therefore, it goes without saying that the circuit of the invention operates at sufficiently high speed for capacitance loads.

In the above-described embodiment, the conductance coefficient of the transistors P5 and N5 is one-fifth of that of the transistors P2 and N2; however, the invention is not limited thereto or thereby.

In the above-described embodiment, while the second analog switch 30 is connected between the first parallel transistor circuit 19 and the first analog switch 18, such a modification is possible that the second analog switch 30 may be connected between the second parallel transistor circuit 20 and the first analog switch 18. In this modification, the effects are the same.

While the invention has been described with reference to the complementary MOS integrated circuit, the technical concept of the invention is applicable to other MOS circuits in the same manner.

The invention has been described with reference to the complementary MOS integrated circuit; however, the technical concept of the invention is applicable to a so-called "BI-CMOS integrated circuit" made up of bi-polar and CMOS circuits. In this case also, the same effects can be obtained.

As described above, according to the invention the resistor utilizing the "on-resistance" of the MOS transistors is connected between the MOS transistor gates in the pre-output circuit, so that the penetration current which occurs when the transistors in the output circuit is switched, is decreased to thereby suppress an occurrence of spike noises. Consequently, the power consumption is also reduced.

What is claimed is:

1. A complementary MOS integrated circuit for suppressing a penetration current, comprising:
   a data input terminal;

$$R(V_{IN} = 0V):R(V_{IN} = V_{cc}/2) = \frac{1}{K(5 - 0 - 0.7)^2 + 1/\infty} : \frac{1}{K(5 - 2.5 - 0.7)^2 + K(2.5 - 0.7)^2} \quad (8)$$
$$= 1:3$$

where Vcc=5 V, and $V_{TH}=0.7$ V.

In the circuit of FIG. 15, the peak of the penetration current of the output circuit occurs when the potential of the input terminal 11 is V2. The penetration current at that time can be represented by the following equation:

$$Icc = K(5 \times (6/28) - 0.7)^2 = 0.14K \quad (9)$$

Where Icc=5 V, $V_{TH}=0.7$ V, K is the conductance coefficient, and $V_{TH}$ is the threshold voltage of a MOS transistor. The transistors P2, P4, N2 and N4 are equal to each other in the conductance coefficient. The conductance coefficient of the transistors P5 and N5 is one-fifth (1/5) of that of the transistors P2, P4, N2 and N4, because the transistors P5 and N5 are used as a an output circuit including a first P-channel MOS transistor and a first N-channel MOS transistor connected in series with each other, said output circuit being coupled between first and second power source terminals and an output signal being produced from a common coupling point of said first P-channel and N-channel MOS transistors; and a pre-output circuit connected to drive said output circuit, said pre-output circuit being coupled between said first and second power source terminals and being in parallel with said output circuit, said pre-output circuit including a second P-channel MOS transistor, a second N-channel MOS transistor and a resistance means connected between said second P-channel and N-channel MOS transistors, said second P-channel MOS transistor having its drain terminal connected to the gate terminal of said first P-channel MOS transistor, and said second N-channel MOS transistor having its drain terminal connected to the gate terminal of said first N-channel MOS transistor, said resistance means including a third P-channel MOS transistor and a third N-channel MOS transistor connected in parallel with each other to constitute an analog switch, gate terminals of said third P-channels MOS transistor and said third N-channel MOS transistor each being connected to said data input terminal, and said resistance means being connected between the drain terminals of said second N-channel and P-channel MOS transistors such that the penetration current is suppressed from flowing in said output circuit.

2. A complementary MOS integrated circuit comprising:

a data input terminal;

an output circuit including a first P-channel MOS transistor and a first N-channel MOS transistor connected in series with each other, said output circuit being coupled between first and second power source terminals and an output signal being produced from a common coupling point of said first P-channel and N-channel MOS transistors; and a pre-output circuit connected to drive said output circuit, which is coupled between said first and second power source terminals in parallel with said output circuit, said pre-output circuit including a first gate means, a second gate means and a resistance means connected between said first and second gate means, said resistance means comprising first and second analog switches;

said second analog switch including a second P-channel MOS transistor whose gate is connected to a first control input terminal and a second N-channel MOS transistor whose gate is connected to a second control input terminal, said second P-channel and N-channel MOS transistors being connected in parallel with each other.

said first gate means including a third P-channel MOS transistor whose gate is connected to said data input terminal and a fourth P-channel MOS transistor whose gate is connected to said second control input terminal, said third and fourth P-channel MOS transistor being connected in parallel with each other between said first power source terminal and the gate of said first P-channel MOS transistor of said output circuit;

said second gate means including a third N-channel MOS transistor whose gate is connected to said data input terminal and a fourth N-channel MOS transistor whose gate is connected to said first control input terminal to receive a first control signal which is opposite in logic level to a second control signal applied to said second control input terminal, said third and fourth N-channel MOS transistors being connected in parallel with each other between the gate of said first N-channel MOS transistor and said second power source terminal; and said first analog switch including a fifth P-channel MOS transistor whose gate is connected to said data input terminal and a fifth N-channel MOS transistor whose gate is connected to said data input terminal, said fifth P-channel and said fifth N-channel MOS transistors being connected in parallel with each other, said first and second analog switches being series-connected between the gates of said first P-channel and N-channel MOS transistors of said output circuit.

3. The circuit as defined in claim 2 wherein a series circuit of said first gate means, said first analog switch, said second analog switch and said second gate means is connected between said first and second power source terminals.

4. The circuit as defined in claim 2 wherein a series circuit of said first gate means, said second analog switch, said first analog switch and said second gate means is connected between sad first and second power source terminals.

* * * * *